United States Patent [19]

Vig et al.

[11] 4,263,702
[45] Apr. 28, 1981

[54] METHOD OF MAKING A QUARTZ RESONATOR

[75] Inventors: John R. Vig, Colts Neck; Raymond L. Filler, Freehold, both of N.J.; R. Donald Peters, Pinnellas Park; James M. Frank, Seminole, both of Fla.

[73] Assignee: The United States of America as represented by the Secretary of the Army, Washington, D.C.

[21] Appl. No.: 40,366

[22] Filed: May 18, 1979

[51] Int. Cl.³ .......................................... H01L 41/22
[52] U.S. Cl. .................................................. 29/25.35
[58] Field of Search ............... 29/25.35; 310/321, 323, 310/354, 348

[56]        References Cited
        U.S. PATENT DOCUMENTS 3,931,388   1/1976   Hafner .................... 174/DIG. 3 X

OTHER PUBLICATIONS

"Polyimide Bonded Resonators"; Filler et al., Jun. 1978.
"The Effect of Bonding on the Frequency Vs. Temp. Characteristics of AT–Cut Resonators"; Filler et al., 1976.
"Force Frequency Compensation . . .", Ballato; Jul. 1978.

*Primary Examiner*—Carl E. Hall
*Attorney, Agent, or Firm*—Nathan Edelberg; Sheldon Kanars; Roy E. Gordon

[57]              ABSTRACT

A quartz resonator is made from a chemically polished quartz plate. The plate is placed in an enclosure fitted with at least three mounting clips to receive the plate. The plate is secured to the clips with an electrically conductive adhesive capable of withstanding operation at 350 degrees C. The assembly is cleaned and a metallic electrode deposited onto the plate until the desired frequency is reached. The enclosure is then hermetically sealed. The resulting resonator can consistently withstand extremely high shocks.

26 Claims, No Drawings

METHOD OF MAKING A QUARTZ RESONATOR

The invention described herein may be manufactured, used and licensed by or for the Government for governmental purposes without the payment to us of any royalty thereon.

This invention relates in general, to a method of making a quartz resonator and in particular, to a method of making a quartz resonator from a chemically polished quartz plate wherein the resonator can withstand extremely high shocks.

BACKGROUND OF THE INVENTION

High stability quartz crystal resonators that can consistently withstand extremely high shocks, such as occur during launch from a howitzer, have not been available previously.

In the past, efforts have been made to prepare quartz resonators that can withstand extremely high shocks by electroplating a nickel rim onto a quartz blank to provide both strength and a non-contaminating bond to the support structure. Although the nickel electrobonding process can permit resonators to survive very high shock levels, the process is difficult to implement and control. Such a nickel electrobonding process is described in the article "Further Results on UV Cleaning and Ni Electrobonding" by J. R. Vig, J. W. LeBus, and R. L. Filler at pages 220 to 229 of the Proceedings of the 29th Annual Symposium on Frequency Control, 1975. The high shock aspect of the nickel electrobonding process is further discussed in the article "The Effect of Bonding On the Frequency vs. Temperature Characteristics of AT-Cut Resonators" by R. L. Filler and J. R. Vig at pages 264 to 268 of the Proceedings of the 30th Annual Symposium On Frequency Control, 1976.

SUMMARY OF THE INVENTION

The general object of this invention is to provide a method of making a quartz resonator that can consistently survive very high shock levels. A further object of the invention is to provide such a method in which the quartz resonator will withstand exposure to high temperatures, thus permitting the use of the high temperature processes commonly employed in the fabrication of high precision resonators.

It has now been found that the aforementioned objects can be obtained by preparing a chemically polished quartz plate, applying metallic contacts to the edge of the chemically polished quartz plate, placing the plate in an enclosure fitted with at least 3 mounting clips, securing the plate to the clips with an electrically conductive bonding agent, cleaning the assembly, depositing metallic electrodes onto both faces of the plate until the desired frequency is reached, and hermetically sealing the enclosure.

By the term "a chemically polished quartz plate", as it is used in this application is meant a plate from which the crystalline damage has been removed. Such chemical polishing is more fully described in copending U.S. patent application Ser. No. 919,113 filed June 26, 1978 of John R. Vig and John W. LeBus for "Method of Treating a Quartz Plate" and assigned to a common assignee. As described in that application, chemical polishing involves lapping a quartz plate with an abrasive and etching the lapped quartz plate in a fluoride type etchant an amount such that the damage produced by lapping is removed.

According to this invention, a metallic contact can then be applied to the edge of the chemically polished quartz plate. The metallic contact used should be a metal having strong adhesion to quartz such as a thin film of molybdenum and a thin film of gold over the molybdenum, or a thin film of chromium and a thin film of gold over the chromium, or a thin film of titanium and a thin film of palladium over the titanium. The metallic contact serves to assure the appropriate electrical connections among the mounting clips, the subsequently applied conductive adhesive and the electrodes. The metallic contact can be applied to the chemically polished quartz plate by standard deposition techniques such as vapor deposition or sputtering. The preferred metallic contact is molybdenum-gold and the preferred method of deposition is electron beam vapor deposition.

The chemically polished quartz plate is then placed into an enclosure fitted with at least three mounting clips to receive the plate. The enclosure may be a standard metallic enclosure such as a TO-5 enclosure, or a ceramic enclosure such as the flat pack described in U.S. Pat. No. 3,931,388 issued Jan. 6, 1976 to E. Hafner and J. R. Vig for "Crystal Resonator Housing Configurations." The mounting clip can be constituted of any metal that does not deform permanently when subject to stresses experienced during high shock. Preferred examples of such metals are molybdenum, or nickel alloys such as Inconel, stainless steel, etc. Two mounting clip configurations that have been found suitable for use in the invention are a "C" clip and an "L" clip as described in the article "Polyimide Bonded Resonators" by R. L. Filler, J. M. Frank, R. D. Peters and J. R. Vig at pages 290 to 298 of the Proceedings of the 32nd Annual Symposium on Frequency Control, 1978. The location of the mounting clips can be adjusted to minimize the effects of stress on the performance of the completed device. One possible configuration is to have four clips located on the edge of the plate at about the points 28 degrees, 152 degrees, 208 degrees, and 332 degrees from the ZZ" axis of the quartz plate. This is the configuration for minimum force-frequency sensitivity, as described in the article "Force-Frequency Compensation Applied to Four-Point Mounting of AT-Cut Resonators" by A. Ballato, at pages 223–226 of the IEEE Transactions on Sonics and Ultrasonics, Vol SU-25, July 1978. Another configuration that has been used successfully involves positioning the clips at about the 45 degree, 135 degree, 225 degree and 315 degree orientations from the ZZ" axis.

The chemically polished quartz plate is then secured to the mounting clips with an electrically conductive bonding agent. The bonding agent can be an electrically conducting adhesive that can withstand exposure to high temperatures and that has a high degree of resistance to levels of shock in excess of 20,000 g. Suitable electrically conductive adhesives include silver filled polyimide, gold filled polyimide, silver filled epoxy, and gold filled epoxy. The polyimide adhesives are preferred. The assembly is then cleaned by standard techniques such as exposure to short wavelength ultra-violet light that generates ozone. Other suitable bonding techniques may be bonding by electroplating, e.g. as in nickel electrobonding, thermocompression bonding, and soldering with materials such as gold-germanium, gold-tin, or indium-tin.

Metallic electrodes are then deposited onto both faces of the plate until the desired frequency is reached. During most of the electrode deposition, the temperature of the quartz plate is maintained at a temperature above 180 degrees C. The final frequency adjusting is performed at room temperature. Any metal conventionally used as an electrode material can be used in the deposition such as gold, aluminum, copper, etc. Standard deposition methods are also used, such as vacuum evaporation, and sputtering.

The resonator assembly is then sealed into the enclosure using art established techniques. Such techniques include gold to gold bonding, aluminum to alumina bonding, cold welding, resistance welding, capacitor discharge welding, or solder sealing.

An alternative to the above fabrication sequence includes base plating the resonators prior to mounting. Such a method, although not preferred for high stability application, does permit the elimination of the deposition of strongly adherent metallic contacts at the edge of the quartz plate.

DESCRIPTION OF THE PREFERRED EMBODIMENT

A quartz plate having a diameter of about 6.4 mm is final lapped with a 1 $\mu$m aluminum oxide abrasive to obtain a plate with a thickness of 100 $\mu$m. The plate is then etched in a saturated solution of ammonium bifluoride at 75 degrees C. to obtain a chemically polished quartz plate having a thickness of 74 $\mu$m. A thin film of molybdenum is then vapor deposited onto four small areas on both major surfaces near the edge of the blank. A thin film of gold is then deposited over the molybdenum.

A ceramic enclosure for the quartz plate is then prepared. The enclosure includes four L-shaped molybdenum mounting clips to receive the plate. The mounting clips are arranged 90 degrees apart to coincide with the molybdenum-gold areas.

The plate is then secured to the mounting clips with silver filled polyimide adhesive such as Ablebond 71-1, the tradename for a silver filled polyimide adhesive marketed by Ablestik Laboratories of Gardena, Calif. The adhesive is applied in such a manner that there is a silver filled polyimide interface between the clip and the plate. The assembly is then cured in a flowing inert gas atmosphere according to the following schedule:
about 20 minutes at about 150 degrees C.
about 20 minutes at about 300 degrees C. and at least
120 minutes at about 350 degrees C.
After the assembly has been cured, it is cleaned by exposure to short wavelength ultraviolet light that generates ozone, until a water contact angle of less than 6 degrees is achieved on the quartz surfaces.

Metallic electrodes are then applied to the plate by vacuum evaporating a thin film of gold on both faces of the plate until the desired frequency is reached. The plate is maintained at about 310 degrees C. during most of the plating.

The resonator assembly is then hermetically sealed into the ceramic enclosure. The sealing technique involves placing a gold gasket inbetween gold metallized surfaces on the ceramic enclosure parts, where the gold metallizations and the gold gaskets have been previously cleaned with short wavelength ultraviolet light that generates ozone. The assembly is then placed in an ultrahigh vacuum, heated to a temperature of about 300 degrees C., and a force of about 800 lbs applied to deform the gold gasket and produce an hermetic seal. Ultrahigh vacuum sealing is not essential, but is preferred for good long term stability.

The resonators thus prepared were subjected to shock tests of 20,000 g for 2.5 milliseconds. The resonators withstood the shock and continued to function satisfactorily. Resonators similarly prepared from quartz plates that were not chemically polished all failed the shock tests, even at much lower shock levels.

The resonators thus prepared also exhibited increased long term stability, when frequency change with time was measured at 85 degrees C. The long term stability was found to average 8.8 parts in 10 to the 10th per day. High shock resonators prepared by a low temperature process were found to have long term stabilities which, on the average, were 34 times worse.

In the method of the invention, the size of the quartz plate can be varied depending on frequency, resistance, and shock requirements. For a given frequency a smaller quartz plate will provide a higher shock resistance.

We wish it to be understood that we do not desire to be limited to the exact details of construction as described for obvious modifications will occur to a person skilled in the art.

What is claimed is:
1. Method of making a quartz resonator wherein the resonator can withstand extremely high shocks, said method including the steps of:
   (a) preparing a chemically polished quartz plate,
   (b) placing the plate in an enclosure fitted with mounting clips to receive said plate,
   (c) securing the plate to the clips with an electrically conductive bonding agent,
   (d) depositing metallic electrodes onto both faces of the plate until the desired frequency is reached, and
   (e) hermetically sealing the enclsoure.
2. Method according to claim 1 wherein between steps (a) and (b) a metallic contact is applied near the edge of the quartz plate.
3. Method according to claim 2 wherein the metallic contact is selected from the group consisting of a thin film of molybdenum and a thin film of gold over the molybdenum, a thin film of chromium and a thin film of gold over the chromium, and a thin film of titanium and a thin film of palladium over the titanium.
4. Method according to claim 3 wherein the metallic contact is a thin film of molybdenum and a thin film of gold over the molybdenum.
5. Method according to claim 3 wherein the metallic contact is a thin film of chromium and a thin film of gold over the chromium.
6. Method according to claim 3 wherein the metallic contact is a thin film of titanium and a thin film of palladium over the titanium.
7. Method according to claim 1 wherein said enclosure is fitted with at least three mounting clips.
8. Method according to claim 7 wherein said enclosure is fitted with four mounting clips.
9. Method according to claim 8 wherein the said mounting clips are placed at about 28 degrees, 152 degrees, 208 degrees, and 332 degrees from the ZZ' axis of the quartz plate.
10. Method according to claim 8 wherein the said mounting clips are placed at about 45 degrees, 135 degrees, 225 degrees, and 315 degrees from the ZZ' direction of the quartz plate.
11. Method according to claim 1 wherein said mounting clips are made of a metal that does not deform permanently when subject to stresses experienced during high shock.

12. Method according to claim 11 wherein said metal is selected from the group consisting of molybdenum, Inconel, and stainless steel.

13. Method according to claim 12 wherein said metal is molybdenum.

14. Method according to claim 12 wherein said metal is Inconel.

15. Method according to claim 12 wherein said metal is stainless steel.

16. Method according to claim 1 wherein said electrically conductive bonding agent is an electrically conductive adhesive selected from the group consisting of silver filled polyimide, gold filled polyimide, silver filled epoxy, and gold filled epoxy.

17. Method according to claim 16 wherein said electrically conductive adhesive is silver filled polyimide.

18. Method according to claim 16 wherein said electrically conductive adhesive is gold filled polyimide.

19. Method according to claim 16 wherein said electrically conductive adhesive is silver filled epoxy.

20. Method according to claim 16 wherein said electrically conductive adhesive is gold filled epoxy.

21. Method according to claim 17 wherein in step C, the assembly is cured in a flowing inert gas atmosphere according to the schedule:
about 20 minutes at about 150 degrees C.
about 20 minutes at about 300 degrees C. and at least 120 minutes at about 350 degrees C.

22. Method according to claim 18 wherein in step C, the assembly is cured in a flowing inert gas atmosphere according to the schedule:
about 20 minutes at about 150 degrees C.
about 20 minutes at about 300 degrees C. and at least 120 minutes at about 350 degrees C.

23. Method according to claim 1 wherein the metallic electrodes of step (d) are deposited at a temperature greater than 180 degrees C.

24. Method according to claim 1 wherein said enclosure is a ceramic flatpack.

25. Method according to claim 1 wherein said enclosure is a metal enclosure.

26. Method of making a quartz resonator from a chemically polished quartz plate wherein the resonator can withstand extremely high shocks, said method consisting of:

(A) vapor depositing a molybdenum-gold contact onto the edge of the plate, (B) placing the plate in an enclosure fitted with four molybdenum mounting clips to receive the plate, (C) securing the plate to the clips with a silver filled polyimide adhesive so that there is a polyimide interface between the clip and the plate and curing the assembly in a flowing inert gas atmosphere according to the schedule:
about 20 minutes at about 150 degrees C.
about 20 minutes at about 300 degrees C. and at least 120 minutes at about 350 degrees C.

(D) cleaning the assembly by exposing it to short wavelength ultraviolet light that generates ozone until a water contact angle of less than 6 degrees is achieved on the quartz surfaces, (E) vacuum evaporating a thin film of gold on both faces of the plate, and (F) hermetically sealing the enclosure in ultrahigh vacuum.

* * * * *